United States Patent
Roy

(10) Patent No.: US 6,670,209 B1
(45) Date of Patent: Dec. 30, 2003

(54) EMBEDDED METAL SCHEME FOR LIQUID CRYSTAL DISPLAY (LCD) APPLICATION

(75) Inventor: Sudipto Ranendra Roy, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 644 days.

(21) Appl. No.: 09/151,948

(22) Filed: Sep. 11, 1998

(51) Int. Cl.⁷ .............................................. H01C 21/00
(52) U.S. Cl. ...................................................... 438/30
(58) Field of Search .......................... 438/30, 638, 637

(56) References Cited

U.S. PATENT DOCUMENTS

| | | | |
|---|---|---|---|
| 5,056,895 A | 10/1991 | Kahn | 359/87 |
| 5,578,523 A | 11/1996 | Fiordalice et al. | 437/190 |
| 5,592,318 A | 1/1997 | Majima et al. | 349/122 |
| 5,635,423 A | 6/1997 | Huang et al. | 437/195 |
| 5,686,790 A | 11/1997 | Curtin et al. | 313/493 |
| 5,696,386 A | 12/1997 | Yamazaki | 257/57 |
| 5,708,486 A | 1/1998 | Miyawaki et al. | 341/44 |
| 5,721,601 A | 2/1998 | Yamaji et al. | 349/138 |
| 5,960,317 A * | 9/1999 | Jeong | 438/633 |
| 6,025,269 A * | 2/2000 | Sandhu | 438/688 |

* cited by examiner

Primary Examiner—W. David Coleman

(74) Attorney, Agent, or Firm—George O. Saile; Rosemary L. S. Pike

(57) ABSTRACT

A process for forming a planarized metal layer by forming the plug and overlying metal interconnect simultaneously in order to maintain a uniform gap between the passivation layer of a bottom substrate and the top substrate of a LCD integrated circuit device is described. Semiconductor device structures in and on a semiconductor substrate wherein the semiconductor device structures are covered by an insulating layer. A trench is patterned into the insulating layer and a via opening is made within the trench through the insulating layer to one of the underlying semiconductor device structures. A metal layer is deposited overlying the insulating layer and within the trench and via opening. The metal layer overlying insulating layer is polished away leaving the metal layer within the trench to form a metal pixel and within the via opening to form an interconnect between the metal pixel and the underlying semiconductor device wherein the top surface of the substrate is planarized. A passivation layer is deposited overlying the top surface of the substrate. A liquid crystal material layer is formed overlying the passivation layer and sandwiched between the bottom substrate and a second semiconductor substrate to complete the fabrication of the liquid crystal display integrated circuit device.

27 Claims, 3 Drawing Sheets

EMBEDDED METAL SCHEME FOR LIQUID CRYSTAL DISPLAY (LCD) APPLICATION

RELATED PATENT APPLICATION

U.S. patent application Ser. No. 09/110,423 to S. R. Roy.

BACKGROUND OF THE INVENTION (1) Field of the Invention

The present invention relates to the fabrication of LCD integrated circuit devices, and more particularly, to a method of passivating the passivation layer of an LCD integrated circuit device in order to maintain a uniform gap height between the top and bottom substrates.

(2) Description of the Prior Art

Liquid crystal displays (LCD) have been used in the art for such applications as computer and television screens. Typically, the topmost level fabricated on a bottom substrate is a series of metal pixels, each pixel 19×19 microns in area. There are typically 1024×768 pixels having a spacing of 0.7 microns between each pixel. The liquid crystal display layer is built on this array of metal pixels and enclosed by a top substrate comprising a transparent material.

FIG. 1 illustrates a LCD integrated circuit device of the prior art. Bottom semiconductor substrate 10 is illustrated. First metal lines 22 are formed overlying a barrier/glue layer 20. An anti-reflective coating (ARC) layer 24 may be formed over the metal lines 22. An insulating layer 26 is deposited over the metal lines. Openings are patterned in the insulating layer 26. The openings are filled with tungsten which is etched back to form tungsten plugs 28. A second level of metal lines 32, usually an aluminum alloy, are formed overlying a second barrier layer 30. The aluminum alloy is separated and protected by a passivation layer, typically 1000 Angstroms of undoped silicate glass (USG) 34 followed by 2500 Angstroms of silicon nitride 36. The liquid crystal material 52 is sandwiched between the passivation layer and the top substrate 56.

For sharp display, high speed, and good performance, it is critical that the liquid crystal maintain a constant gap between the top and bottom substrates. The crucial gap height is not maintained in the process of the prior art. As seen in FIG. 1, the height A above the metal pixels is not the same as the height B between the metal pixels.

There are a number of patents in the field of LCD's. For example, U.S. Pat. No. 5,696,386 to Yamazaki, U.S. Pat. No. 5,708,486 to Miyakawaki et al, and U.S. Pat. No. 5,868,790 to Curtain et al discuss LCD formations in which the gap width is non-constant. U.S. Pat. No. 5,056,895 to Kahn teaches an insulating leveling layer of polymer or spin-on-glass. U.S. Pat. No. 5,721,601 to Yamaji et al discloses a spin-on-glass planarizing film. U.S. Pat. No. 5,592,318 to Majima et al teaches planarizing with a polyimide resin.

U.S. Pat. No. 5,635,423 to Huang et al and U.S. Pat. No. 5,578,523 to Fiordalice et al teach dual damascene processes to form a plug and trench and fill them with a single conducting material. Damascene is an art which has been used for centuries in jewelry making and which has been used recently in the semiconductor industry. Damascene involves the formation of a trench which is filled in with metal and then planarized.

SUMMARY OF THE INVENTION

Accordingly, a primary object of the invention is to provide a process for maintaining a uniform gap between the passivation layer of a bottom substrate and the top substrate of a LCD integrated circuit device.

A further object of the invention is to provide a process for forming a planarized metal layer in the fabrication of an integrated circuit device.

Another object is to provide a process for forming a planarized metal layer in order to maintain a uniform gap between the passivation layer of a bottom substrate and the top substrate of a LCD integrated circuit device.

Yet another object of the invention is to provide a process for forming a planarized metal layer by forming the plug and overlying metal interconnect simultaneously in order to maintain a uniform gap between the passivation layer of a bottom substrate and the top substrate of a LCD integrated circuit device.

Yet another object of the invention is to provide a process for forming a planarized metal layer by using a dual damascene process in order to maintain a uniform gap between the passivation layer of a bottom substrate and the top substrate of a LCD integrated circuit device.

In accordance with the objects of the invention, a process for forming a planarized metal layer by forming the plug and overlying metal interconnect simultaneously in order to maintain a uniform gap between the passivation layer of a bottom substrate and the top substrate of a LCD integrated circuit device is achieved. Semiconductor device structures are formed in and on a semiconductor substrate wherein the semiconductor device structures are covered by an insulating layer. A trench is patterned into the insulating layer and a via opening is made within the trench through the insulating layer to one of the underlying semiconductor device structures. A metal layer is deposited overlying the insulating layer and within the trench and via opening. The metal layer overlying the insulating layer is polished away leaving the metal layer within the trench to form a metal pixel and within the via opening to form an interconnect between the metal pixel and the underlying semiconductor device wherein the top surface of the substrate is planarized. A passivation layer is deposited overlying the top surface of the substrate. A liquid crystal material layer is formed overlying the passivation layer and sandwiched between the bottom substrate and a second semiconductor substrate to complete the fabrication of the liquid crystal display integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
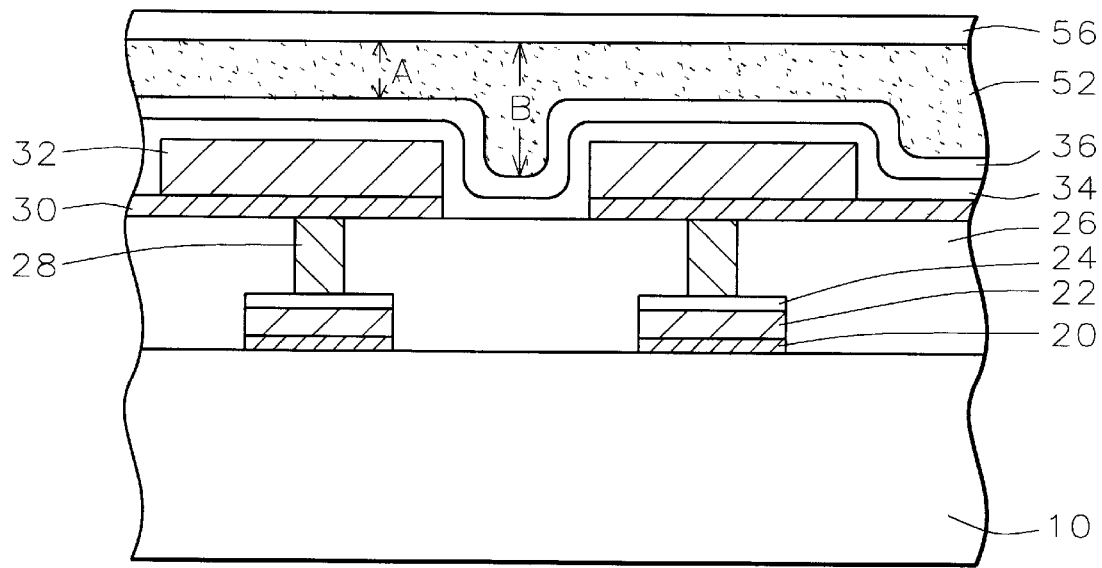
FIG. 1 is a cross-sectional representation of an LCD device of the prior art.
Figure 2:
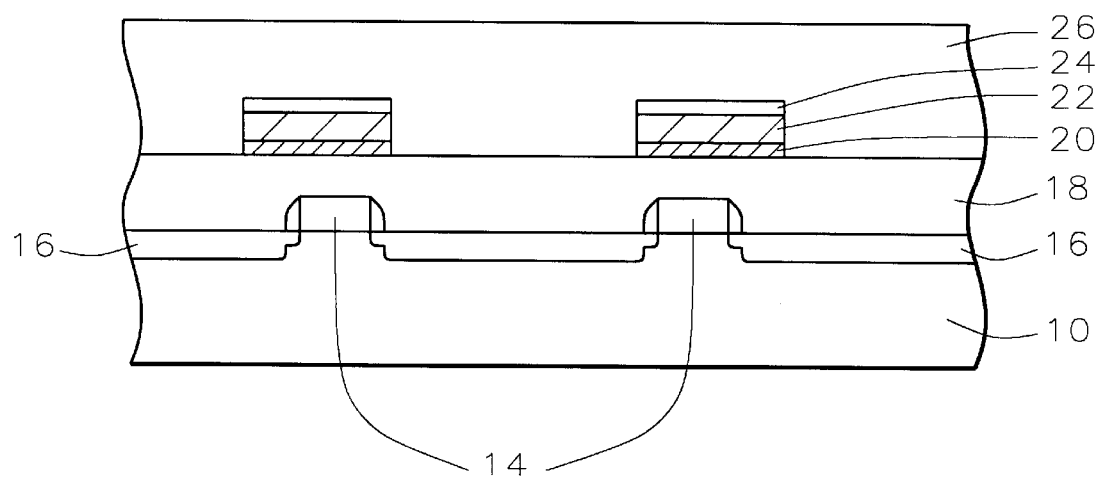
FIGS. 2–6 are cross-sectional representations of a preferred embodiment of the present invention.

Referring now more particularly to FIG. 2, there is shown a semiconductor substrate 10, preferably composed of monocrystalline silicon. Semiconductor device structures which may include polysilicon gate electrodes 14 and source and drain regions 16 are shown. An insulating layer 18 is formed overlying the semiconductor device structures. In a simple application such as an on/off operation, semiconductor device structures are unnecessary. However, for precise control, speed, etc., such as in required for television, these structures are necessary.

A barrier/glue layer 20, comprising titanium/titanium nitride, is deposited over the insulating layer 18. A layer of conducting material, such as aluminum or an aluminum alloy, is deposited over the barrier/glue layer and patterned to form metal lines 22. An anti-reflective coating (ARC) layer 24 may be deposited over the metal layer before patterning. An insulating layer 26, such as silicon dioxide, undoped silicate glass (USG), tetraethoxysilane (TEOS) oxide, or the like, is deposited over the metal lines to a thickness of between about 10,000 and 20,000 Angstroms. This is much thicker than a typical dielectric layer. The thickness is similar to the sum of the metal-3 and tungsten plug thicknesses which will average about 15,000 Angstroms.

Figure 3:
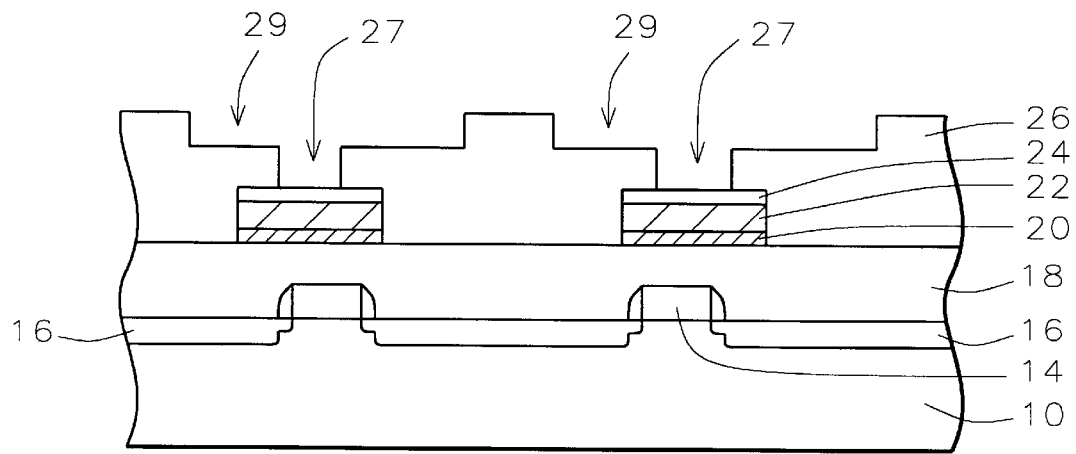
Figure 4:
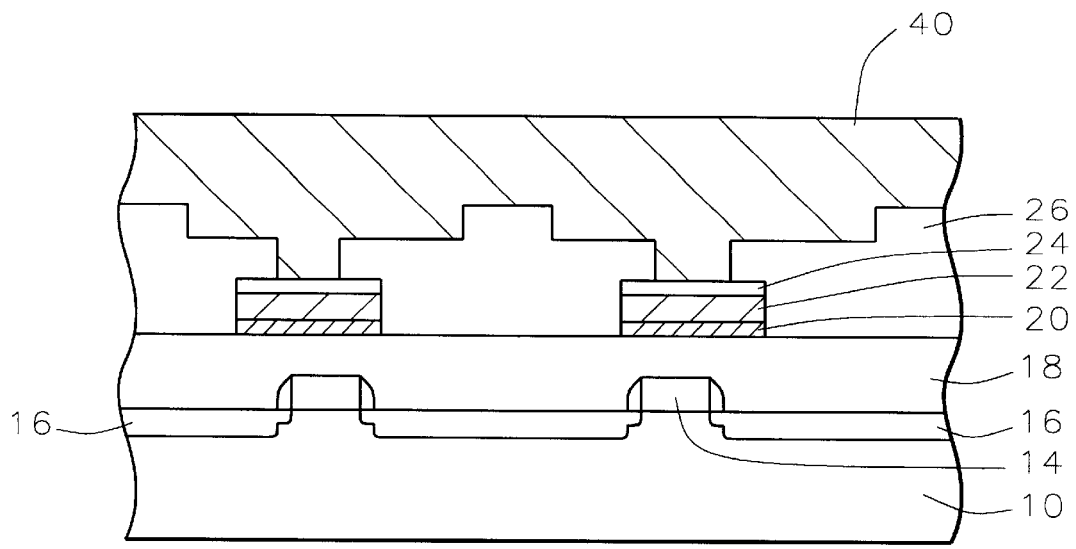

Referring now to FIG. 3, the novel process of the present invention will be described. The plug pattern 27 and metal-3 pattern 29 are formed sequentially within the insulating layer 26, as shown. This patterning may be performed in any number of conventional methods with either the plug pattern formed first or the metal-3 pattern formed first. Alternatively, both patterns may be formed simultaneously. This is a dual damascene structure because both the plug 27 and the trench 29 are formed before they are filled together with one material.

A barrier/glue layer 38 comprising, for example, titanium/titanium nitride is deposited over the insulating layer 26 and within the openings 27 and 29. Metal layer 40 is deposited over the barrier/glue layer 38. The metal layer is typically aluminum or an aluminum alloy. This metal layer will form both the metal pixels 44 and the plugs 42 connecting the pixels to the metal lines 22.

Figure 5:
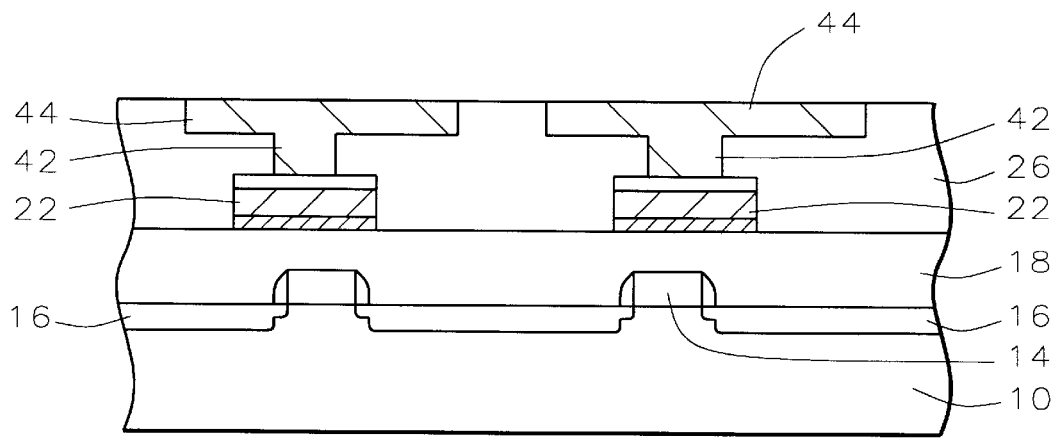

The excess metal and barrier/glue layer, 40 and 38, respectively, above the surface of the insulating layer 26 are polished away using chemical mechanical polishing (CMP). FIG. 5 illustrates the resulting metal pixels 44 and plugs 42. After CMP, the metal pixels 44 are buried within the insulating layer 26. The surface of the wafer has been planarized by the CMP process.

Figure 6:
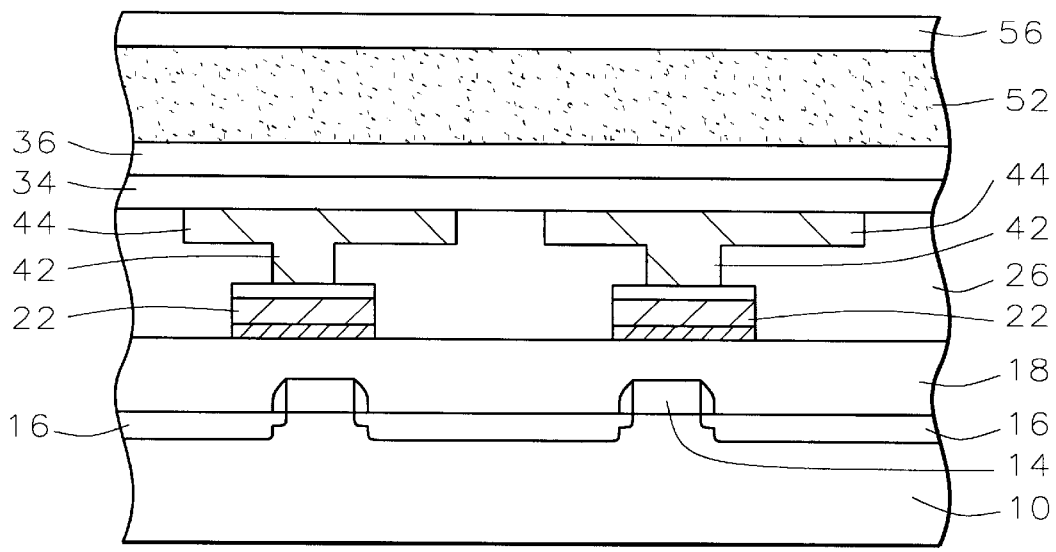

The passivation layer is formed on this planarized surface as is conventional in the art, as illustrated in FIG. 6. For example, undoped silicate glass (USG) 34 is deposited over the metal pixels 44 buried within the insulating layer 26 to a thickness of between about 500 and 1000 Angstroms. A silicon nitride layer 36 is deposited over the USG layer to a thickness of 2000 and 3000 Angstroms.

Since the top surface of the bottom electrode is planarized, the gap between the top and bottom electrodes which is to be filled with the liquid crystal material will be uniform.

As shown in FIG. 6, the top substrate 56 lies at a precise distance from the top of the bottom substrate. The liquid crystal material 52 fills the gap between the two substrates.

The process of the present invention uses a dual damascene process to form the metal pixels and connecting plugs within the insulating layer. This results in a planarized surface underlying the passivation layer. The LCD is built on this planarized surface which allows a precise gap between the top and bottom substrates.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a liquid crystal display integrated circuit device comprising:

providing semiconductor device structures in and on a semiconductor substrate wherein said semiconductor device structures are covered by an insulating layer;

patterning a trench into said insulating layer and a via opening within said trench through said insulating layer to one of said underlying semiconductor device structures;

depositing a metal layer overlying said insulating layer and within said trench and said via opening;

polishing away said metal layer overlying said insulating layer leaving said metal layer within said trench to form a metal pixel and within said via opening to form an interconnect between said metal pixel and said underlying semiconductor device wherein the top surface of said substrate is planarized;

depositing a passivation layer overlying said top surface of said substrate;

forming a liquid crystal material layer overlying said passivation layer; and attaching a second semiconductor substrate overlying said liquid crystal material layer to complete the fabrication of said liquid crystal display integrated circuit device.

2. The method according to claim 1 wherein said semiconductor device structures include gate electrodes and associated source and drain regions and multiple layers of metal lines and intermetal dielectric.

3. The method according to claim 1 wherein said insulating layer comprises silicon oxide and has a thickness of between about 10,000 and 20,000 Angstroms.

4. The method according to claim 1 further comprising depositing a barrier layer within said trench and said via opening underlying said metal layer.

5. The method according to claim 4 wherein said barrier layer comprises titanium/titanium nitride.

6. The method according to claim 1 wherein said metal layer comprises aluminum.

7. The method according to claim 1 wherein said metal layer comprises an aluminum alloy.

8. The method according to claim 1 wherein said step of depositing said passivation layer comprises:

depositing a first layer of undoped silicate glass overlying said top surface of said substrate; and depositing a second layer of silicon nitride overlying said undoped silicate glass layer.

9. The method according to claim 8 wherein said undoped silicate glass layer has a thickness of between about 500 and 1000 Angstroms.

10. The method according to claim 8 wherein said silicon nitride layer has a thickness of between about 2000 and 3000 Angstroms.

11. The method according to claim 8 wherein said step of polishing is performed by chemical mechanical polishing.

12. A method of fabricating a liquid crystal display integrated circuit device comprising:

providing semiconductor device structures in and on a semiconductor substrate wherein said semiconductor device structures are covered by an insulating layer;

patterning a trench into said insulating layer and a via opening within said trench through said insulating layer to one of said underlying semiconductor device structures;

depositing a metal layer overlying said insulating layer and within said trench and said via opening;

polishing away said metal layer overlying said insulating layer leaving said metal layer within said trench to form a metal pixel and within said via opening to form an interconnect between said metal pixel and said underlying semiconductor device wherein the top surface of said substrate is planarized;

depositing a passivation layer overlying said top surface of said substrate wherein said passivation layer comprises a first layer of undoped silicate glass and a second layer of silicon nitride;

forming a liquid crystal material layer overlying said passivation layer; and attaching a second semiconductor substrate overlying said liquid crystal material layer to complete the fabrication of said liquid crystal display integrated circuit device.

13. The method according to claim 12 wherein said semiconductor device structures include gate electrodes and associated source and drain regions and multiple layers of metal lines and intermetal dielectric.

14. The method according to claim 12 wherein said insulating layer comprises silicon oxide and has a thickness of between about 10,000 and 20,000 Angstroms.

15. The method according to claim 12 further comprising depositing a barrier layer within said trench and said via opening underlying said metal layer.

16. The method according to claim 15 wherein said barrier layer comprises titanium/titanium nitride.

17. The method according to claim 12 wherein said metal layer comprises aluminum.

18. The method according to claim 12 wherein said metal layer comprises an aluminum alloy.

19. The method according to claim 12 wherein said undoped silicate glass layer has a thickness of between about 500 and 1000 Angstroms.

20. The method according to claim 12 wherein said silicon nitride layer has a thickness of between about 2000 and 3000 Angstroms.

21. The method according to claim 12 wherein said step of polishing is performed by chemical mechanical polishing.

22. A method of fabricating a liquid crystal display integrated circuit device comprising:

providing semiconductor device structures in and on a semiconductor substrate wherein said semiconductor device structures are covered by an insulating layer;

patterning a trench into said insulating layer and a via opening within said trench through said insulating layer to one of said underlying semiconductor device structures;

depositing a barrier metal layer overlying said insulating layer and within said trench and said via opening;

depositing a metal layer overlying said barrier metal layer;

polishing away said metal layer and said barrier metal layer overlying said insulating layer leaving said barrier metal layer and said metal layer within said trench to form a metal pixel and within said via opening to form an interconnect between said metal pixel and said underlying semiconductor device wherein the top surface of said substrate is planarized;

depositing a passivation layer overlying said top surface of said substrate wherein said passivation layer comprises a first layer of undoped silicate glass and a second layer of silicon nitride;

forming a liquid crystal material layer overlying said passivation layer; and attaching a second semiconductor substrate overlying said liquid crystal material layer to complete the fabrication of said liquid crystal display integrated circuit device.

23. The method according to claim 22 wherein said semiconductor device structures include gate electrodes and associated source and drain regions and multiple layers of metal lines and intermetal dielectric.

24. The method according to claim 22 wherein said insulating layer comprises silicon oxide and has a thickness of between about 10,000 and 20,000 Angstroms.

25. The method according to claim 22 wherein said barrier metal layer comprises titanium/titanium nitride.

26. The method according to claim 22 wherein said metal layer comprises aluminum.

27. The method according to claim 22 wherein said metal layer comprises an aluminum alloy.

* * * * *